United States Patent
Bozzini

(10) Patent No.: US 6,396,132 B1
(45) Date of Patent: May 28, 2002

(54) SEMICONDUCTOR DEVICE WITH IMPROVED INTERCONNECTIONS BETWEEN THE CHIP AND THE TERMINALS, AND PROCESS FOR ITS MANUFACTURE

(75) Inventor: Pieramedeo Bozzini, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/502,070

(22) Filed: Feb. 10, 2000

(30) Foreign Application Priority Data

Feb. 11, 1999 (EP) .............................. 99830072

(51) Int. Cl.[7] ............................ H01L 33/495
(52) U.S. Cl. .................. 257/672; 257/666; 257/668; 438/123
(58) Field of Search ................ 257/666, 668, 257/671, 672; 438/123

(56) References Cited

U.S. PATENT DOCUMENTS

| | | | |
|---|---|---|---|
| 3,544,857 A | | 12/1970 | Byrne et al. ............ 257/668 |
| 4,110,838 A | * | 8/1978 | Noe ........................ 365/2 |
| 5,874,773 A | * | 2/1999 | Terada et al. ............ 257/676 |
| 5,945,729 A | * | 8/1999 | Stroupe ................... 257/666 |

FOREIGN PATENT DOCUMENTS

| | | | |
|---|---|---|---|
| EP | 0 435 093 A2 | 12/1990 | |
| JP | 408124957 A | * 5/1996 | ........ H01L/21/60 |

OTHER PUBLICATIONS

"Chip Attachment to Tape and Cable", IBM Technical Disclosure Bulletin, vol. 25, No. 4, Sep. 1982, pp. 1954–1956.

* cited by examiner

*Primary Examiner*—Nathan Flynn
*Assistant Examiner*—Scott R. Wilson
(74) *Attorney, Agent, or Firm*—Lisa K. Jorgenson; Allen, Dyer, Doppelt, Milbrath & Gilchrist, P.A.

(57) ABSTRACT

A chip of semiconductor material is fixed to a supporting area of a film of insulating material. Electrical interconnecting elements join metallized areas of the chip to the ends of metal strips which form the terminals of the device. To obtain devices with numerous terminals without approaching the dimensional limits imposed by the manufacture of the terminal frames, the interconnecting elements include electrically conductive tracks formed on the film of insulating material. The electrical connection between the ends of the terminals and the tracks is made by strips of anisotropic conductive material.

8 Claims, 2 Drawing Sheets

SEMICONDUCTOR DEVICE WITH IMPROVED INTERCONNECTIONS BETWEEN THE CHIP AND THE TERMINALS, AND PROCESS FOR ITS MANUFACTURE

FIELD OF THE INVENTION

The present invention relates to the field of electronic semiconductor devices, and, more particularly, to a process for manufacturing electronic semiconductor devices.

BACKGROUND OF THE INVENTION

As is known, integrated circuits are formed on chips of semiconductor material which require, for their connection to external electrical circuits, suitable supporting, containing and electrical interconnection structures. A typical structure suitable for the purpose is enclosed in a plastic body and comprises a chip which is fixed to a flat support and is connected, by wires soldered to suitable metallized areas (pads) provided on its surface, to the ends, located inside the plastic body, of corresponding electrical conductors emerging from the body.

For the manufacture of these structures, the chip is fixed on a supporting element, for example by gluing with a suitable adhesive. Then a set of metal strips, joined together by interconnecting sections to form a frame (lead frame), is prepared and placed around the chip. The metal strips, which are designed to become the terminal conductors of the device, are formed, usually by punching, from a sheet of metal. Thin wires, usually made from gold, are soldered at one end to the metallized areas of the chip and at the other end to the ends of the metallic strips. The resulting structure, together with other identical structures connected together for serial production, is mounted in a suitable press mold into which a thermosetting epoxy resin in the liquid state is poured. The polymerization of the resin produces a structure which comprises a solid plastic body which incorporates the elements described above, with the exception of part of the metal strips, in other words of the terminal conductors of the device, and of the interconnecting sections between them. These sections are then removed by punching to produce the finished electronic device.

It is known that an increase in the integration density is accompanied by an increase in the number of terminals of the integrated circuit to be connected to the exterior. It is therefore desirable to reduce the size of the strips of sheet metal designed to form the terminals of the device, so that their density can be increased. The minimum limit for size of the strips is determined by the thickness of the sheet metal, which, moreover, cannot be less than a minimum value imposed by the necessity of providing a certain degree of rigidity, and by the requirements of the punching operation or of other cutting operations. It is also desirable to shape the strips in such a way that their ends are as close as possible to the chip but do not interfere with each other. Some of the strips are therefore made in the form of curves or bent lines. However, this requires longer and less rigid strips, and therefore entails greater difficulties in the operations of soldering the wires and greater risks of short circuit between the strips or between the wires.

Additionally, the connecting wires extend in the form of an arc in a direction perpendicular to the plane of the chip, and the height of the arc increases with the length of the wire (evidently within the practical limits of the application of this connection method) and therefore the thickness of the plastic body cannot be less than the minimum value necessary to cover the wire completely. Moreover, a frame of strips shaped in such a way as to be most suitable for use with a chip of given dimensions and with a given arrangement of the metallized areas cannot generally be used with chips having different dimensions and different arrangements of metallized areas. This causes a considerable increase in manufacturing costs, since a suitable lead frame must be designed and manufactured for each device.

SUMMARY OF THE INVENTION

An object of the present invention is to provide a device which is easily and economically manufactured and has a structure such that the prior art connection problems mentioned above are reduced, and a process for manufacturing this device.

This object is achieved according to the invention by providing a chip of semiconductor material fixed to a supporting area of a film of insulating material. Electrical interconnecting elements join metallized areas of the chip to the ends of metal strips which form the terminals of the device. To obtain devices with numerous terminals without approaching the dimensional limits imposed by the manufacture of the terminal frames, the interconnecting elements include electrically conductive tracks formed on the film of insulating material. The electrical connection between the ends of the terminals and the tracks is made by strips of anisotropic conductive material.

BRIEF DESCRIPTION OF THE DRAWINGS

The invention will be more clearly understood from the following detailed description of one embodiment thereof, provided by way of non-limiting example with reference to the attached drawings, in which.

DETAILED DESCRIPTION OF THE PREFERRED EMBODIMENTS

Figure 1:
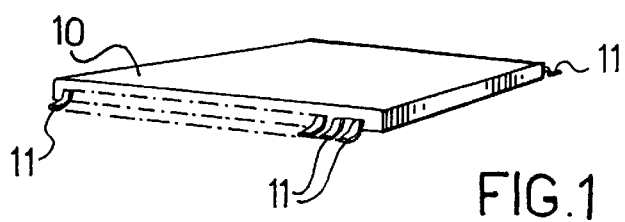
FIG. 1 is an enlarged perspective view of a device of the type which can be manufactured according to the invention.
Figure 2:
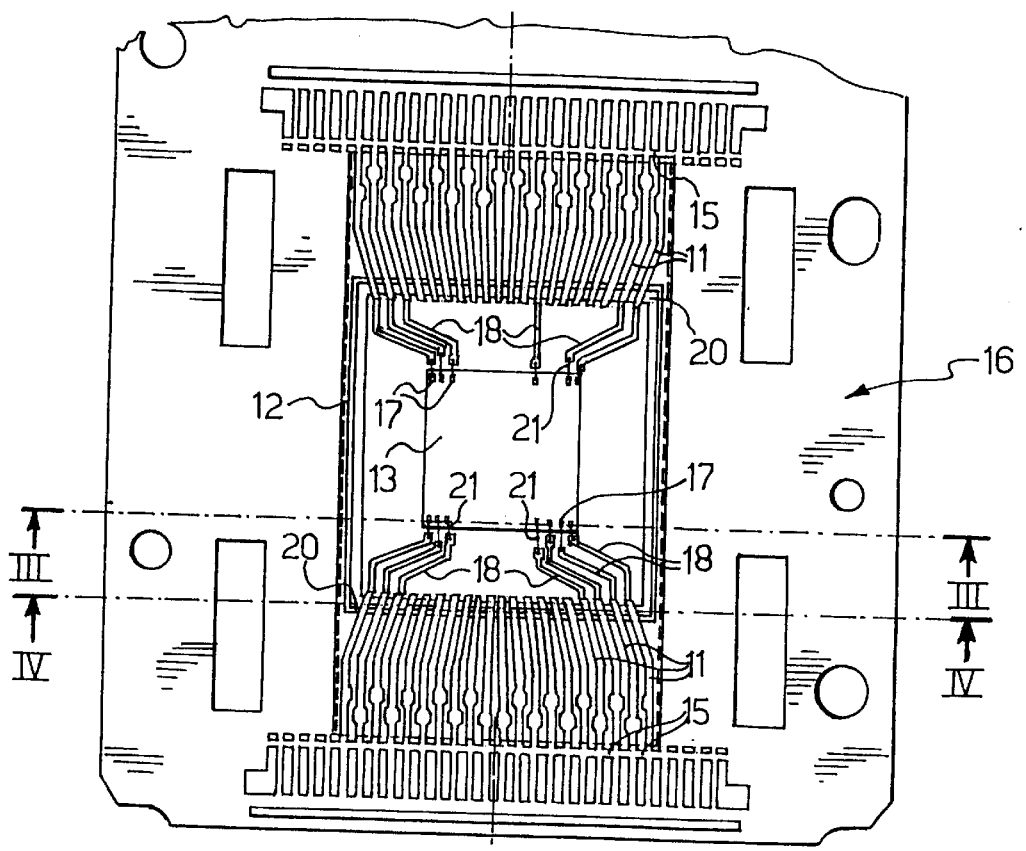
FIG. 2 is a plan view of the structure of the device according to the invention as it appears during one phase of its manufacture.
Figure 3:
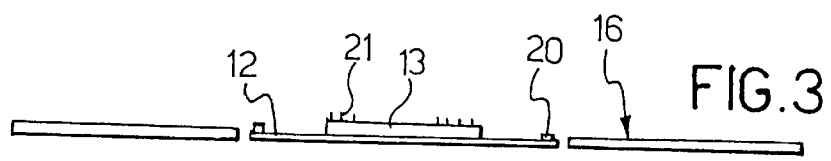
FIGS. 3 and 4 are two cross-sectional views through the line III—III and the line IV—IV respectively in FIG. 2.
Figure 4:
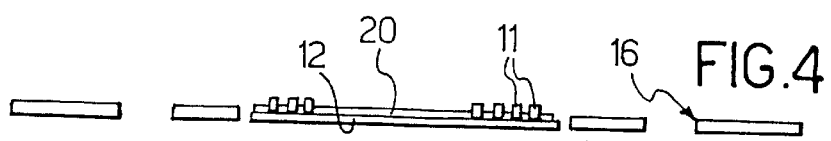
Figure 5:
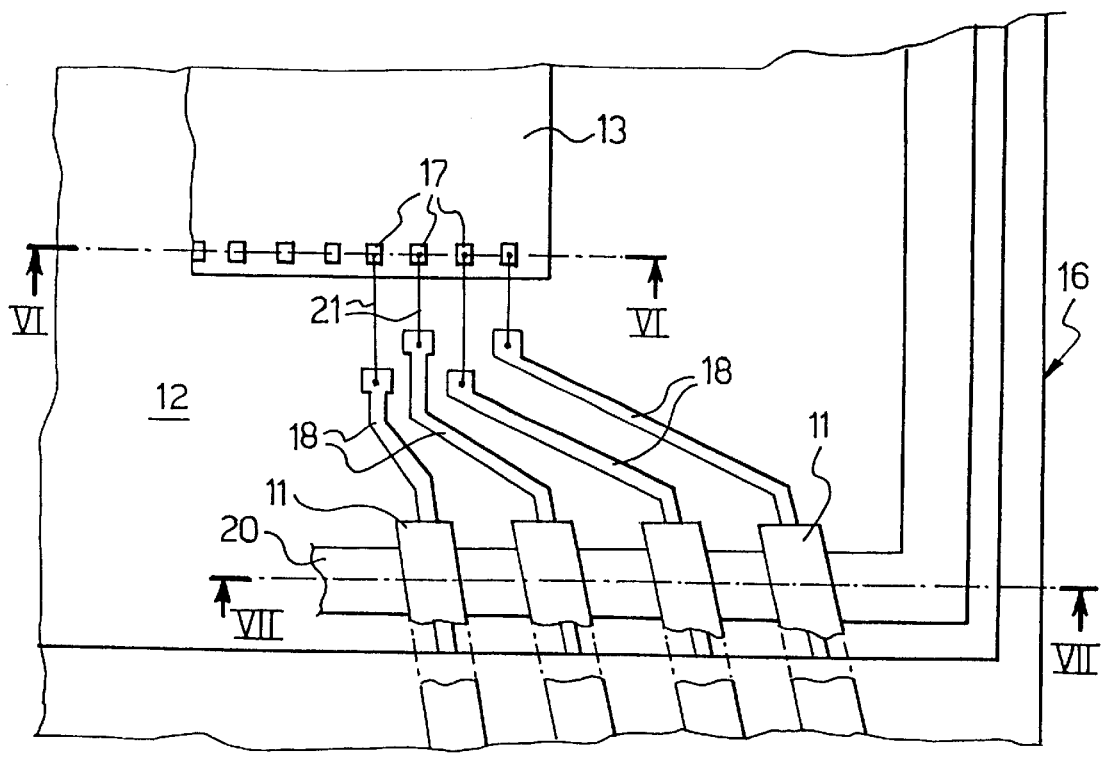
FIGS. 5, 6 and 7 are enlarged views of portions of the structure of the device according to the invention as shown in FIGS. 2, 3 and 4 respectively.
Figure 6:
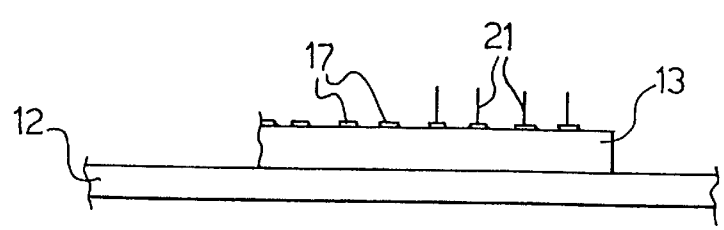

The device comprises a plastic body 10, shown in FIG. 1, a multiplicity of metal strips 11 which form the terminal conductors of the device, a film of insulating material 12, for example polyamide, which comprises a supporting area on which a chip 13 of semiconductor material is fixed comprising the active part of the device, in other words an integrated circuit. On its front surface, the chip 13 has a multiplicity of metallized areas (pads) 17, the number of which is equal to the number of terminal conductors 11. The terminal conductors 11 are formed, in a conventional way, by punching from a strip of sheet metal and are joined together and to the rest of the strip by connecting sections 15, in such a way to form, in combination, a frame 16, commonly termed a "lead frame".

Electrical interconnecting elements are provided between the metallized areas 17 of the chip and the ends of the terminal conductors 11. These interconnecting elements comprise electrically conductive tracks 18 formed on the film 12, for example by conventional process of depositing a layer of copper and photo-engraving, and thin wires of metal, preferably gold, soldered at one end to the metallized areas 17 of the chip and at the other end to the ends of the tracks 18 nearest the chip.

Advantageously, the connection between the tracks 18 and the terminal conductors 11 required to complete the electrical connection of the metallized areas 17 of the chip to the terminal conductors 11 s made by interposing a layer of anisotropic conductive material between them. A material of this type includes a sheet of insulating material, known as an "anisotropic conductive layer", which incorporates metal microspheres distributed uniformly throughout the whole thickness of the sheet. This material normally acts as a dielectric, but may change its electrical characteristics locally, becoming a good conductor, if it is subjected to heating and compression simultaneously.

In this embodiment of the invention, a strip 20 of anisotropic conductive material is arranged on the film 12 between the opposing faces of the connecting ends of the terminal conductors 11 and the tracks 18. Preferably, for convenience of manufacture, the two strips 20 form part of a frame punched in one piece from a sheet of material.

Figure 7:
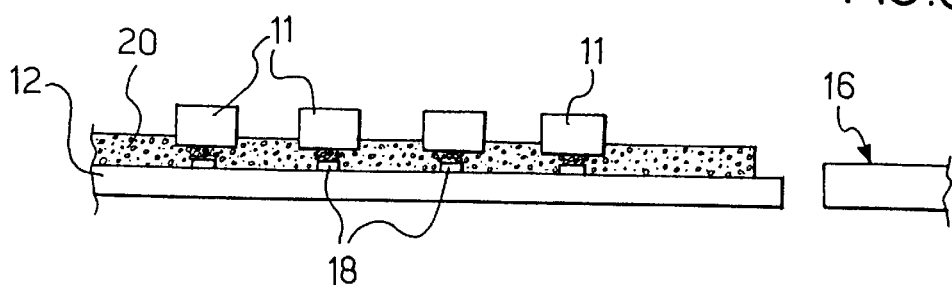

With a suitable tool, the ends of the terminal conductors 11 are pressed against the opposing tracks 18 with a pressure ranging from 1 to 3 kg/cm$^2$, while they are heated, one at a time or all together, to a temperature ranging from 150 to 180° C. The material stressed in this way undergoes a plastic deformation restricted to the portion subjected to compression. In this portion, the microspheres become denser until they come into contact with each other and with the opposing conductive surfaces, thus creating a conductive path between them, as shown in FIG. 7.

The manufacturing process continues with the known operations of soldering wires (wire bonding), indicated by 21, between the metallized areas 17 and the inner ends of the tracks 18; forming the plastic body by injection molding of epoxy resin in the liquid state in a suitable mold and subsequent polymerization; punching the connecting sect Ions 15; and bending the terminals to produce a finished device such as the one shown in FIG. 1.

As an alternative to the "wire bonding" operation, the method known as the "flip chip" method may also be used for electrically interconnecting the inner ends of the tracks 18 and the metallized areas 17 of the chip. In this case, the chip is mounted upside down, with respect to the structure shown in the figures, and the tracks 18 extend under the chip so that their ends overlap the metallized areas 17. The electrical connection is made by fusing and resolidifying small quantities of fusible alloy provided at the ends of the tracks.

As may easily be understood, the object of the invention is fully achieved. This is because the terminal conductors can be formed with sizes and spacings sufficiently large to ensure high rigidity of the individual conductors; thee wire interconnections can be made without problems through very short lengths of wire, thus eliminating any risk of short circuit between the wires and between the terminals and making it possible to manufacture very thin housings; and a single framework of terminal conductors (lead frame) can be used for chips having different sizes and different arrangements of the metallized areas, simply by changing the lengths and shapes of the metal tracks, in other words, in practice, by replacing only the film 12 with the corresponding tracks.

Moreover, in the embodiment which is illustrated and described, the electrical connection between the ends of the terminal conductors 11 and the tracks 18 is made in an extremely practical and efficient way by the use of the strips of anisotropic conductive material.

That which is claimed is:
1. A semiconductor device, comprising
   a planar supporting element comprising an insulating film;
   a semiconductor chip fixed to the insulating film of the supporting element and having metallized areas on a surface of the chip, the chip comprising an active part of the device;
   a plurality of terminal conductors on the supporting element and comprising metal strips each with a corresponding connecting end;
   electrical interconnecting elements connected between the metallized areas of the chip and the connecting ends of the terminal conductors and comprising electrically conductive tracks formed on the insulating film; and
   hermetic sealing means which encloses the chip, the connecting ends of the terminal conductors and the electrical interconnecting elements.
2. A device according to claim 1, wherein the connecting ends of the terminal conductors and the electrically conductive tracks have opposing faces; and further comprising a scrip of anisotropic conductive material located on the insulating film between the opposing faces; and wherein the strip of anisotropic conductive material defines electrically conducting portions of each of the electrical interconnecting elements.
3. A device according to claim 2, wherein the electrical interconnecting elements comprise metal wires, each of which is soldered at one end to one of the metallized areas of the chip, and at the other end to an end of one of the electrically conductive tracks.
4. A device according to claim 1, wherein the hermetic sealing means comprises a plastic body.
5. A semiconductor device, comprising
   a supporting element comprising an insulating material;
   a semiconductor chip secured to the supporting element and comprising an active part of the device, and the chip having electrically conductive connection pads on a surface thereof;
   a plurality of terminal conductors on the supporting element and comprising electrically conductive strips each with a corresponding connecting end;
   electrical interconnecting elements connected between the electrically conductive connection pads of the chip and the connecting ends of the terminal conductors and comprising electrically conductive tracks formed on the insulating material of the supporting element; and
   a chip sealing body for enclosing the chip, the connecting ends of the terminal conductors and the electrical interconnecting elements.
6. A device according to claim 5, wherein the connecting ends of the terminal conductors and the electrically conductive tracks have opposing faces; and further comprising a strip of anisotropic electrically conductive material located on the supporting element between the opposing faces; and wherein the strip of anisotropic electrically conductive material defines electrically conducting portions of each of the electrical interconnecting elements.
7. A device according to claim 6, wherein the electrical interconnecting elements comprise electrically conductive wires, each of which is soldered at one end to one of the electrically conductive connector pads of the chip, and at the other end to an end of one of the electrically conductive tracks.
8. A device according to claim 5, wherein the chip sealing body comprises a plastic body.

* * * * *